(12) United States Patent
Harada et al.

(10) Patent No.: US 11,101,225 B2
(45) Date of Patent: Aug. 24, 2021

(54) SEMICONDUCTOR DEVICE AND POWER CONVERSION DEVICE

(71) Applicant: Mitsubishi Electric Corporation, Tokyo (JP)

(72) Inventors: Hiroyuki Harada, Tokyo (JP); Naoki Yoshimatsu, Tokyo (JP); Osamu Usui, Tokyo (JP); Yuji Imoto, Tokyo (JP); Yuki Yoshioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/472,097

(22) PCT Filed: Feb. 9, 2017

(86) PCT No.: PCT/JP2017/004799
§ 371 (c)(1),
(2) Date: Jun. 20, 2019

(87) PCT Pub. No.: WO2018/146780
PCT Pub. Date: Aug. 16, 2018

(65) Prior Publication Data
US 2020/0098701 A1    Mar. 26, 2020

(51) Int. Cl.
*H01L 23/057*     (2006.01)
*H01L 23/047*     (2006.01)
(Continued)

(52) U.S. Cl.
CPC .......... *H01L 23/562* (2013.01); *H01L 23/047* (2013.01); *H01L 23/3142* (2013.01);
(Continued)

(58) Field of Classification Search
CPC ....................................................... H01L 23/48
See application file for complete search history.

(56) References Cited

U.S. PATENT DOCUMENTS

2008/0258318 A1   10/2008  Kimura
2009/0127679 A1*   5/2009  Fan ..................... H01L 23/4951
                                                                257/666
(Continued)

FOREIGN PATENT DOCUMENTS

JP       S61-12050 A       1/1986
JP       H2-281737 A      11/1990
(Continued)

OTHER PUBLICATIONS

International Search Report; Written Opinion; and Notification of Transmittal of the International Search Report and the Written Opinion of the International Searching Authority, or the Declaration issued in PCT/JP2017/004799; dated Apr. 25, 2017.
(Continued)

*Primary Examiner* — Omar F Mojaddedi
(74) *Attorney, Agent, or Firm* — Studebaker & Brackett PC (57) ABSTRACT

A semiconductor chip (6) is disposed on the insulation substrate (2). A lead frame (8) is bonded to an upper surface of the semiconductor chip (6). A sealing resin (12) covers the semiconductor chip (6), the insulation substrate (2), and the lead frame (8). A stress mitigation resin (13) having a lower elastic modulus than that of the sealing resin (12) is partially applied to an end of the lead frame (8).

15 Claims, 7 Drawing Sheets

(51) Int. Cl.
  *H01L 23/31* (2006.01)
  *H01L 23/495* (2006.01)
  *H01L 23/24* (2006.01)
  *H01L 23/373* (2006.01)
  *H01L 23/36* (2006.01)
  *H01L 23/28* (2006.01)
  *H01L 25/07* (2006.01)
  *H01L 25/18* (2006.01)
  *H01L 23/48* (2006.01)
  *H01L 23/00* (2006.01)
  *H02P 27/08* (2006.01)

(52) U.S. Cl.
  CPC ...... *H01L 23/4951* (2013.01); *H01L 23/4952* (2013.01); *H01L 23/49562* (2013.01); *H01L 23/49568* (2013.01); *H01L 23/49575* (2013.01); *H02P 27/08* (2013.01)

(56) References Cited

U.S. PATENT DOCUMENTS

| 2013/0161801 A1* | 6/2013 | Otremba | H01L 23/49811 257/668 |
| 2014/0268780 A1* | 9/2014 | Wang | H05K 1/028 362/249.06 |
| 2015/0266728 A1* | 9/2015 | Geissler | H01L 24/19 438/51 |
| 2016/0111379 A1 | 4/2016 | Ishiyama et al. | |

FOREIGN PATENT DOCUMENTS

| JP | H04-307760 A | 10/1992 |
| JP | 2972679 B2 | 11/1999 |
| JP | 2008-288566 A | 11/2008 |
| JP | 4492448 B2 | 6/2010 |
| JP | 2016-82048 A | 5/2016 |

OTHER PUBLICATIONS

An Office Action; "Notice of Reasons for Refusal," mailed by the Japanese Patent Office dated Aug. 25, 2020, which corresponds to Japanese Patent Application No. 2018-566713 and is related to U.S. Appl. No. 16/472,097 with English language translation.

* cited by examiner

SEMICONDUCTOR DEVICE AND POWER CONVERSION DEVICE

FIELD

The present invention relates to a semiconductor device and a power conversion device wherein a semiconductor chip is sealed by a sealing resin.

BACKGROUND

With development of industrial equipment, electric railways, and automobiles, the working temperature of a semiconductor chip for use therein has also been improved. In recent years, a semiconductor chip operating even at high temperatures has been vigorously developed, resulting in progress of miniaturization, enhancement of the breakdown voltage, and enhancement of the current density of the semiconductor chip. Particularly, use of a wide bandgap semiconductor such as SiC or GaN having a larger bandgap than that of Si has led to expectation for higher breakdown voltage, smaller size, higher current density, and higher-temperature operation of the semiconductor chip. In order to integrate a semiconductor chip having such features into a device, even when the semiconductor chip operates at a temperature as high as 150° C. or more, it is necessary to suppress peeling of a sealing resin, deterioration of wires, and cracking of a joint material for ensuring the stable operation of a semiconductor device.

In contrast, in order to prevent the reduction of the moisture resistance caused by the interface peeling between a sealing resin of an epoxy resin and a lead frame, a semiconductor device has been proposed in which a resin layer with a low hardness such as a silicone resin is provided on the lead frame upper surface for improving the adhesion therebetween (e.g., see PTL 1). Whereas, a semiconductor device has been proposed which is precoated with a polyimide resin excellent in heat resistance and moisture resistance before being sealed with an epoxy resin, thereby being improved in the thermal fatigue life and the moisture resistance of the solder joint part at the same time (e.g., see PTL 2).

CITATION LIST

Patent Literature

[PTL 1] Japanese Patent No. 2972679
[PTL 2] Japanese Patent No. 4492448

SUMMARY

Technical Problem

A semiconductor device has a member having a low linear expansion coefficient such as a semiconductor chip or an insulation substrate. For this reason, the peeling between a low linear expansion coefficient member and an epoxy resin becomes a problem due to a heat cycle in terms of insulation reliability for an epoxy resin-sealed semiconductor device, although the peeling has not become a problem for a prior art silicone gel-sealed semiconductor device. For this reason, in recent years, a sealing resin having a low linear expansion coefficient characteristic obtained by heavily adding a filler made of ceramic to an epoxy resin has been used.

However, a sealing resin in which a filler is heavily added has an increased elastic modulus, and a lowered toughness. Further, the lead frame includes a metal member, and has a higher linear expansion coefficient than that of a semiconductor chip or an insulation substrate. For this reason, peeling is caused at the interface between the sealing resin having a low linear expansion coefficient and the lead frame. This undesirably results in occurrence of resin cracking. Furthermore, the resin viscosity tends to increase due to an increase in an amount of a filler added, and mixing of voids in the sealing resin is also undesirably caused.

The methods disclosed in PTL 1 and 2 have an effect on the improvement of the adhesion between an epoxy resin and other members, and the moisture resistance improvement. However, in PTL 1, the end of the lead frame at which an internal stress tends to be generated to cause resin cracking is not coated with a stress mitigation resin; this entails a concern about the reduction of the insulation characteristics in association with the resin cracking of a semiconductor device. Whereas, in PTL 2, the entire region of a semiconductor device is not coated with a stress mitigation resin; accordingly, a narrow gap region such as the lower side of the lead frame is also coated with the stress mitigation resin, resulting in a still narrower narrow gap region. Therefore, in the narrow gap region, the sealing resin does not flow, so that voids are left therein. This unfavorably remarkably impairs the insulation reliability of the semiconductor device.

The present invention was completed in order to solve the foregoing problem. It is an object thereof to obtain a semiconductor device and a power conversion device with high insulation reliability obtained by suppressing peeling and cracking of the sealing resin, and reducing voids left in the sealing resin.

Solution to Problem

A semiconductor device according to the present invention includes: an insulation substrate; a semiconductor chip disposed on the insulation substrate; a lead frame bonded to an upper surface of the semiconductor chip; a sealing resin covering the semiconductor chip, the insulation substrate, and the lead frame; and a stress mitigation resin partially applied to an end of the lead frame and having a lower elastic modulus than that of the sealing resin.

Advantageous Effects of Invention

In the present invention, the end of the lead frame is coated with a stress mitigation resin having a lower elastic modulus than that of the sealing resin. Therefore, a semiconductor device and a power conversion device with high insulation reliability can be obtained by suppressing peeling and cracking of the sealing resin, and reducing voids left in the sealing resin.

DESCRIPTION OF EMBODIMENTS

A semiconductor device and a power conversion device according to the embodiments of the present invention will be described with reference to the drawings. The same components will be denoted by the same symbols, and the repeated description thereof may be omitted.

Embodiment 1

Figure 1:
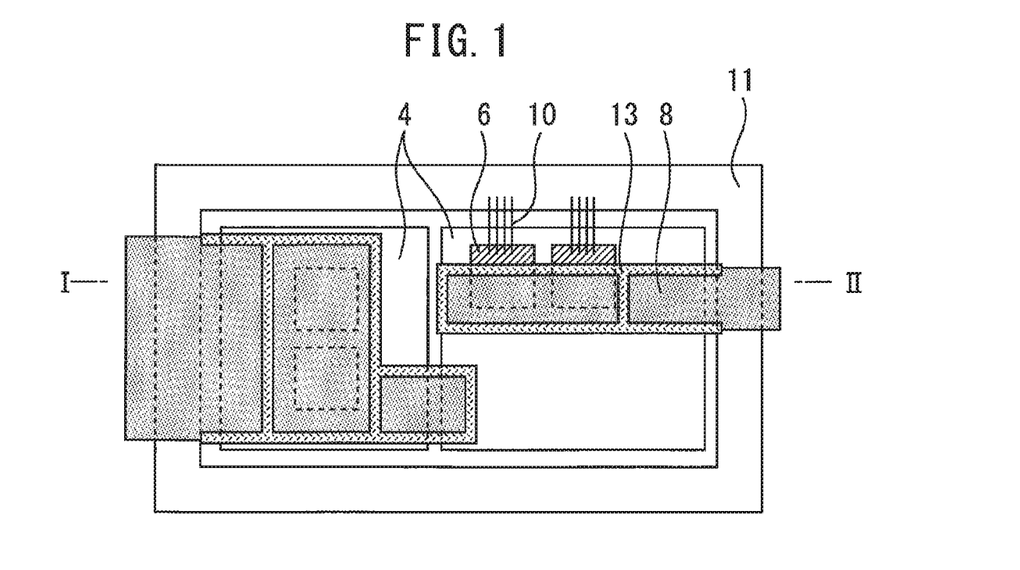
FIG. 1 is a top view showing a semiconductor device according to Embodiment 1 of the present invention.
Figure 2:
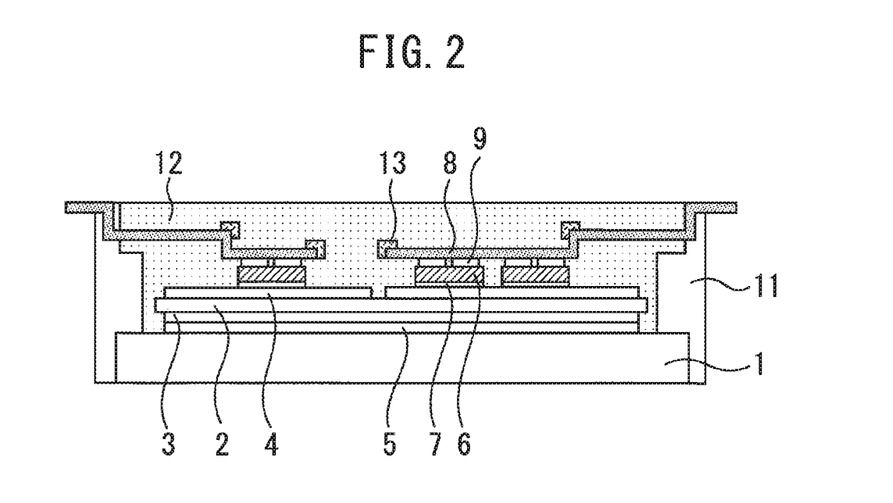
FIG. 2 is a cross sectional view along I-II of FIG. 1.

FIG. 1 is a top view showing a semiconductor device according to Embodiment 1 of the present invention. FIG. 2 is a cross sectional view along I-II of FIG. 1. The semiconductor device of the present embodiment is a semiconductor power module to be widely used, for example, for household electrical appliances, for industry, for automobiles, for trains, and the like.

An insulation substrate 2 is provided on a base plate 1. An electrode pattern 3 is provided on the lower surface of the insulation substrate 2, and an electrode pattern 4 is provided on the upper surface thereof. The electrode pattern 3 of the insulation substrate 2 is bonded with the base plate 1 by a joint material 5 such as solder.

The insulation substrate 2 is a ceramic plate of $AlO_3$, $SiO_2$, AlN, BN, $Si_3N_4$, or the like. The insulation substrate 2 is required to have a heat releasing property and an insulating property, and, not limited to the above description, may be a resin cured product including a ceramic powder dispersed therein, or a resin cured product including a ceramic plate buried therein. A structure in which the insulation substrate 2 and the base plate 1 are in an integral form is also acceptable. The ceramic powders to be used for the insulation substrate 2 are those of $Al_2O_3$, $SiO_2$, AlN, BN, $Si_3N_4$, and the like. However, not limited thereto, diamond, SiC, $B_2O_3$ and the like are also acceptable. The resins for use in the insulation substrate 2 are usually epoxy resins, but are not limited thereto. A polyimide resin, a silicone resin, an acrylic resin, and the like are also acceptable, and any materials are acceptable so long as they are materials having both the insulating property and the adhesion property.

A semiconductor chip 6 is disposed on the insulation substrate 2. The semiconductor chip 6 is an IGBT, a MOSFET, a Diode, or the like. The main electrode on the lower surface of the semiconductor chip 6 is bonded with the electrode pattern 4 of the insulation substrate 2 by a joint material 7. Further, in the drawing, only two semiconductor chips 6 are mounted on one electrode pattern 4. However, not limited thereto, the semiconductor chips 6 in a number required according to use thereof can be mounted.

A lead frame 8 is bonded to the main electrode on the upper surface of the semiconductor chip 6 by a joint material 9. A wire 10 is connected with a control electrode on the upper surface of the semiconductor chip 6. The semiconductor chip 6 is electrically connected with the outside via the lead frame 8 and the wire 10.

For the base plate 1, the electrode patterns 3 and 4, and the lead frame 8, copper is usually used. However, not limited thereto, any material can be used so long as the material has a heat releasing characteristic. For example, aluminum or iron may be used, or a composite material thereof may be used. Alternatively, a composite material such as copper/invar/copper may be used, or an alloy such as SiCAl or CuMo may be used. Further, the surface thereof is usually subjected to nickel plating. However, not limited thereto, gold or tin plating may be performed. Any structure is acceptable so long as it is a structure capable of feeding necessary current and voltage to the semiconductor chip 6.

The wire 10 is a linear body circular in cross section made of aluminum or gold, but, not limited to this, may be, for example, a band-like copper plate rectangular in cross section. Further, in the drawing, four wires 10 are connected to the semiconductor chip 6, but, not limited to this, the wires 10 are provided in a number required according to the current density of the semiconductor chip 6, or the like. For bonding of the wire 10, molten metal of copper, tin, or the like, ultrasonic bonding, and the like can be used. However, the method/structure has no particular restriction so long as it is a method/structure capable of feeding necessary current and voltage to the semiconductor chip 6.

A case 11 is disposed on the outer circumference of the base plate 1, and surrounds the semiconductor chip 6, the insulation substrate 2, and the lead frame 8. The case 11 is desirably a resin material having a high heat softening point, and is, for example, a PPS (Poly Phenylene Sulfide) resin. However, the material has no particular restriction so long as it is a material not thermally deformed within the working temperature region of the semiconductor device, and having an insulating property. Any structure is acceptable so long as it is a structure obtained by combining the lead frame 8 by insert forming or outsert forming.

The case 11 is filled with a sealing resin 12, and covers the semiconductor chip 6, the insulation substrate 2, and the lead frame 8. The sealing resin 12 is, for example, an epoxy resin, but, not limited to this, may only be a resin having desirable elastic modulus and heat resistance. Incidentally, in order to improve the adhesion with the sealing resin 12, at least a part of the surfaces of the electrode patterns 3 and 4, and the lead frame 8 may be provided with microscopic unevenness, or may be provided with an adhesion improver such as a primer processing. Incidentally, a semiconductor device of a mold type structure without the case 11 formed therein is also acceptable.

Figure 3:
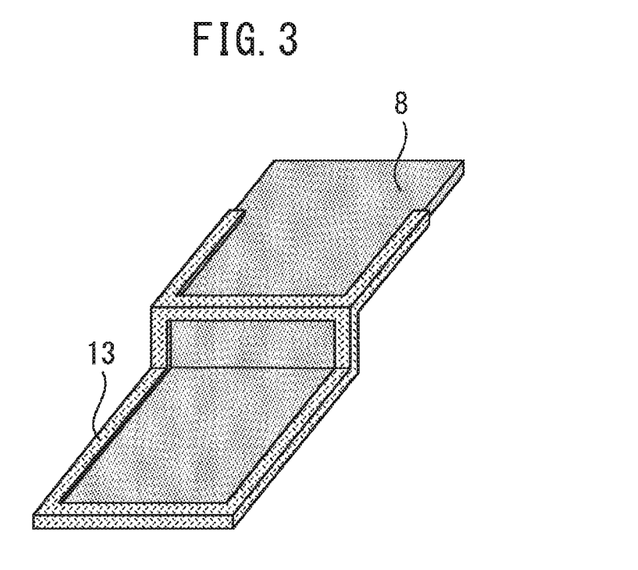
FIG. 3 is a perspective view showing a lead frame according to Embodiment 1 of the present invention.

FIG. 3 is a perspective view showing a lead frame according to Embodiment 1 of the present invention. The stress caused by the difference in linear expansion coefficient between the sealing resin 12 and the lead frame 8 concentrates on the end of the lead frame 8. Thus, in the present embodiment, the end of the lead frame 8 that is the stress concentrated portion is coated with a stress mitigation resin 13 having a lower elastic modulus than that of the sealing resin 12. This can mitigate the stress applied on the sealing resin 12. For this reason, it is possible to suppress peeling and resin cracking of the sealing resin 12 in association with the heat cycle at the interface between the lead frame 8 and the sealing resin 12. Herein, the end of the lead frame 8 is the outer circumferential part of the lead frame 8, the corner part of the bending part of the lead frame 8, and the circumference of an opening or a slit formed in the lead frame 8. Further, the stress mitigation resin 13 covers not only the upper surface but also the side surface of the end of the lead frame 8. As a result, the suppressing effect of resin cracking is further improved.

The materials for the stress mitigation resin 13 are silicone resins, urethane resins, polyimide resins, polyamide resins, polyamideimide resins, acrylic resins, and the like. However, not limited thereto, any materials are acceptable so long as they are the materials having both the insulating property and the adhesion property.

The coating method of the stress mitigation resin 13 is generally application by a dispenser. Various members such as the semiconductor chip 6 or the insulation substrate 2 are bonded to the base plate 1. After adhesion of the base plate 1 and the case 11, and before filled with the sealing resin 12, the stress mitigation resin 13 is applied. Alternatively, before adhesion of the base plate 1, the case 11, and the lead frame 8, the stress mitigation resin 13 may be applied. When the curing conditions for the stress mitigation resin 13 and the curing conditions for the adhesive agent for use in adhesion between the case 11 and the base plate 1 can be used in combination, the stress mitigation resin 13 can also be cured simultaneously with adhesion thereof. Alternatively, by using a mask, if required, the stress mitigation resin 13 can be coated only to a given site of the lead frame 8. In the case using a mask, not only application by a dispenser, but also spray coating by a spray method, or direct dipping to the solution of the stress mitigation resin 13 are also acceptable.

The stress mitigation resin 13 is applied partially to the end of the lead frame 8, and the upper surface of the lead frame 8 has an exposed part not covered with the stress mitigation resin 13. The exposed pert is surrounded by the stress mitigation resin 13, thereby forming a dam structure. Specifically, in the dam structure, the exposed part of the upper surface of the lead frame 8 is surrounded by only the stress mitigation resin 13 provided along the four sides therearound, is surrounded by the stress mitigation resin 13 provided along the three sides, and the bending part of the lead frame 8 provided along one side, or is surrounded by the stress mitigation resin 13 provided along the three sides, and the inner wall of the case 11 provided along one side.

Figure 4:
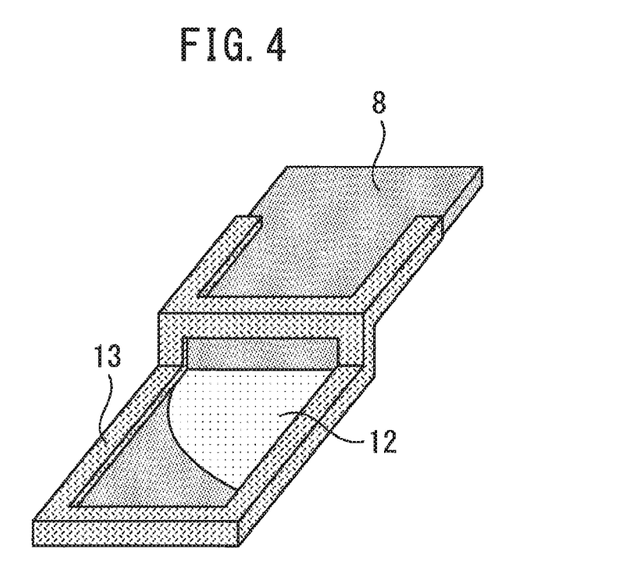
FIG. 4 is a perspective view for illustrating the dam structure according to Embodiment 1 of the present invention.

FIG. 4 is a perspective view for illustrating the dam structure according to Embodiment 1 of the present invention. The dam structure formed of the stress mitigation resin 13 dams up the sealing resin 12 flowing on the upper surface of the lead frame 8. Incidentally, when the entire surface of the lead frame 8 is covered with the stress mitigation resin 13, such a dam structure is not formed. Thus, the sealing resin 12 flowing on the upper surface of the lead frame 8 cannot be dammed up.

Figure 5:
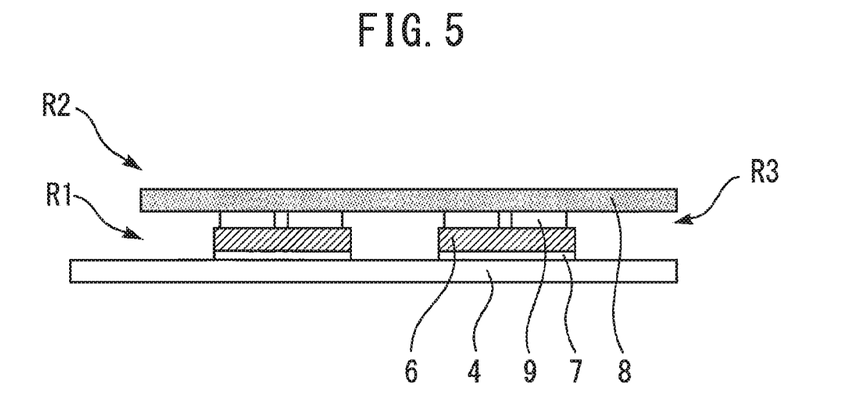
FIG. 5 is a cross sectional view for showing the inflow path of a sealing resin in a semiconductor device according to Comparative Example.
Figure 6:
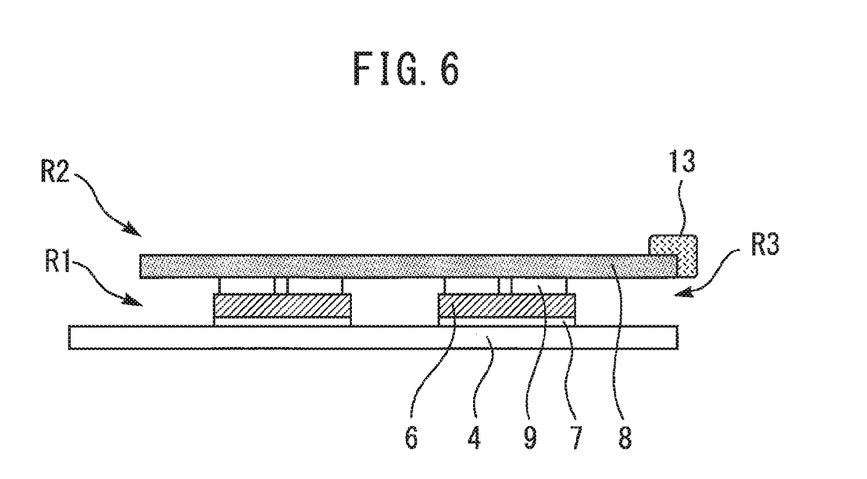
FIG. 6 is a cross sectional view showing the inflow path of the scaling resin in the semiconductor device according to Embodiment 1 of the present invention.

Subsequently, the manner of injecting the sealing resin of the semiconductor device according to the present embodiment will be described by comparison with Comparative Example. FIG. 5 is a cross sectional view for showing the inflow path of a sealing resin in a semiconductor device according to Comparative Example. FIG. 6 is a cross sectional view showing the inflow path of the sealing resin in the semiconductor device according to Embodiment 1 of the present invention. In Comparative Example, the stress mitigation resin 13 is not provided.

Examples of filling methods with the sealing resin 12 include a method in which the sealing resin 12 is injected from a prescribed one point to fill the interior of the case 11 with the sealing resin 12. In the vicinity of the semiconductor chip 6 from the inlet R1 on the lower side of the lead frame 8, a narrow gap region with a height of about 1 to 3 mm is present. Herein, the insulation substrate 2 is generally a ceramic having a low linear expansion coefficient. In a highly elastic type of the sealing resin 12 a typical example of which is an epoxy resin, in order to suppress detachment of the insulation substrate 2 from the sealing resin 12 in association with a heat cycle, a filler is heavily added to achieve a low linear expansion coefficient. Accordingly, the sealing resin 12 is increased in elastic modulus and viscosity, and hence the sealing resin 12 has a low flowability, and it may be difficult to fill the sealing resin 12 into the narrow gap region.

When the viscosity of the sealing resin 12 is low, the filled sealing resin 12 flows into the narrow gap region, and successively seals the upper surface of the insulation substrate 2, the semiconductor chip 6, and the joint material 9. For this reason, also in Comparative Example, highly reliable sealing not leaving voids in the sealing resin 12 is possible. On the other hand, when the viscosity of the sealing resin 12 is high, it takes time for the sealing resin 12 to pass through the inlet R1 of the narrow gap region, so that the sealing resin 12 is accumulated at the inlet R1. The bulked-up sealing resin 12 starts to extend on the upper surface of the lead frame 8 from the inflow path R2. For this reason, in Comparative Example, before the sealing resin 12 passes through the narrow gap region, the sealing resin 12 flowed on the upper surface of the lead frame 8 goes around to flow into the narrow gap region from the inlet R3 opposite to the inlet R1. The sealing resin 12 flowed from the opposite sides cuts off the escape of air on the lower side of the lead frame 8, so that voids are trapped in the sealing resin 12. Traps of voids at the time of resin injection tend to be caused particularly in the narrow gap region between the semiconductor chips 6 or between the joint materials on the upper part of the semiconductor chips 6, and tend to be caused particularly in the structure in which the lead frame 8 covers 50% or more of the surface area of the upper surface of the semiconductor chip 6.

Also in the present embodiment, as with Comparative Example, the sealing resin 12 extends from the inflow path R2 to the upper surface of the lead frame 8. However, the sealing resin 12 is dammed up by the dam structure of the stress mitigation resin 13, and remains on the upper surface of the lead frame 8 until the height of the sealing resin 12 reaches the height of the stress mitigation resin 13. For this reason, the sealing resin 12 can be suppressed from going around to the lower surface of the lead frame 8 from the inlet R3, so that the sealing resin 12 can be flowed into the narrow gap region on the lower surface side of the lead frame 8 from one direction. This can prevent the occurrence of void traps in the sealing resin 12. For this reason, it is possible to obtain a semiconductor device with a high reliability with respect to the electric insulating property.

Subsequently, a semiconductor device for evaluation test was manufactured, and a heat cycle test was conducted. The results thereof will be described. The lead frame 8 was formed by a copper plate bonded with the semiconductor chip 6 via a solder joint material, and the case 11 was attached thereto by an adhesive agent. Then, the stress mitigation resins 13 distributed with prescribed elastic moduli were formed. Then, sealing was performed with the liquid sealing resin 12 including an epoxy resin in which an elastic modulus was adjusted by increasing or decreasing the filling rate of a filler, and the sealed product was heated at 160° C. for two hours. As a result, semiconductor devices for evaluation were manufactured. The whole semiconductor device was placed in a thermostat capable of temperature control. The temperature of the thermostat was repeatedly changed between −40° C. to 160° C. to carry out a heat cycle test. In the heat cycle test, the evaluating sample was held at −40° C. for 30 minutes, followed by holding at 160° C. for 30 minutes. With this procedure as one cycle, the cycle was repeated 1000 times. After the heat cycle test, as the failure mode, nondestructive peeling observation by an ultrasonic reflectoscope, and the observation of resin cracking by cross-sectional observation were carried out.

A plurality of evaluating samples corresponding to Embodiment 1, and a reference sample with the lead frame 8 not coated with the stress mitigation resin 13 were formed. Table 1 shows the results of the heat cycle test of the samples corresponding to Embodiment 1 and the reference sample. As the stress mitigation resins 13, polyimide resins with four kinds of elastic moduli were coated so as to achieve a film thickness of 20 μm by a dispenser. As the sealing resins 12, three kinds of epoxy resins with elastic moduli of 10 GPa, 12 GPa, and 15 GPa were used. Each evaluation was carried out for two semiconductor devices. The item for which all the two devices passed is expressed as "○"; the item for which one device passed is expressed as "Δ"; and the item for which no device passed is expressed as "×", after 1000 cycles of the heat cycle test.

TABLE 1

|  |  | None | 2 GPa | 5 GPa | 8 GPa | 10 GPa |
|---|---|---|---|---|---|---|
| 10 GPa | Peeling | ○ | ○ | ○ | ○ | ○ |
|  | Cracking | ○ | ○ | ○ | ○ | ○ |
| 12 GPa | Peeling | × | ○ | ○ | ○ | Δ |
|  | Cracking | Δ | ○ | ○ | ○ | ○ |
| 15 GPa | Peeling | × | ○ | ○ | ○ | × |
|  | Cracking | × | ○ | ○ | ○ | Δ |

For the reference sample in which the lead frame 8 was not coated with the stress mitigation resin 13, when the elastic modulus of the sealing resin 12 was 10 GPa, neither peeling nor cracking were observed. However, when the elastic modulus of the sealing resin 12 was 12 GPa or more, peeling and cracking were caused.

For the semiconductor device coated with the stress mitigation resin 13 with an elastic modulus of 2 GPa to 8 GPa, it was found that peeling and cracking were not caused even after 1000 cycles of the heat cycle test. Whereas, for the semiconductor device coated with the stress mitigation resin 13 of 10 GPa, it was found as follows: when the elastic modulus of the sealing resin 12 was 10 GPa, peeling and cracking were also not observed after the heat cycle test; however, when the elastic modulus of the sealing resin 12 was 12 GPa, peeling was caused; and when the elastic modulus of the sealing resin 12 was 15 GPa, peeling and cracking were caused.

As a result of the experiment, it has been shown that, by coating the lead frame 8 with the stress mitigation resin 13, it is possible to suppress peeling and cracking of the sealing resin 12 due to the heat cycle in a high temperature region. Further, it has been proved that when the elastic modulus of the stress mitigation resin 13 is 8 GPa or less, a semiconductor device with higher reliability can be manufactured.

Further, the upper surface of the stress mitigation resin 13 is higher than the upper surface of the lead frame 8 by 5 μm to 5 mm. The stress mitigation resin 13 is higher by 5 μm or more. This can suppress the generation of void traps in the sealing resin 12. Further, the stress mitigation resin 13 preferably has a thickness of 5 μm or more also in order not to leave the uncoated portion of the end of the lead frame 8 of the stress mitigation resin 13. However, the stress mitigation resin 13 is preferably lower than the height of the sealing resin 12 on the lead frame 8. When the stress mitigation resin 13 is higher than 5 mm, wet spreading is often caused on the lead frame 8, so that the stress mitigation resin 13 itself undergoes cracking due to a heat cycle. For this reason, 5 mm or less is preferable.

Further, in the present embodiment, an increase in current density, and disconnection in association with the heat cycle environment of the wire are suppressed, thereby improving the reliability of the semiconductor device. To this end, the lead frame 8 is used. However, a wire 10 may be used partially in such a range as not to impair the reliability characteristics of the semiconductor device. When the flowability of the sealing resin 12 is low, there is a concern that voids are mixed into the lower part of the lead frame 8. However, by partially using the wire 10, the residual voids become more likely to escape.

Embodiment 2

Figure 7:
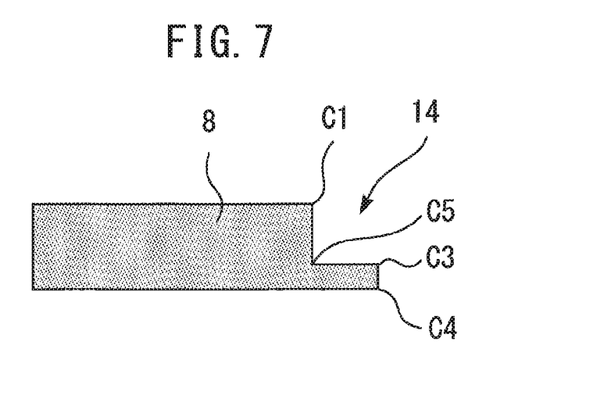
FIG. 7 is a cross sectional view illustrating the end of a lead frame according to Embodiment 2 of the present invention.

FIG. 7 is a cross sectional view illustrating the end of a lead frame according to Embodiment 2 of the present invention. The present embodiment is different in structure of the end of the lead frame 8 from Embodiment 1, and is the same in other configurations as Embodiment 1. An upper surface thin type structure is formed in which a step 14 resulting in a smaller thickness of the lead frame 8 is provided on the upper surface of the end of the lead frame 8. The stress mitigation resin 13 is applied to the upper part of the step 14.

Figure 8:
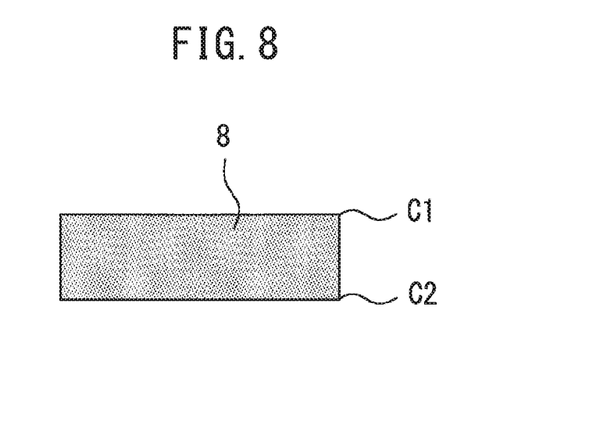
FIG. 8 is a cross sectional view illustrating the end of the lead frame according to Comparative Example.

Subsequently, the effects of the present embodiment will be described by comparison with Comparative Example. FIG. 8 is a cross sectional view illustrating the end of the lead frame according to Comparative Example. In Comparative Example, the step 14 is not disposed. A stress due to a heat cycle is caused particularly at the corner parts C1 and C2 of the end of the lead frame 8. Therefore, for mitigation of the stress at the end of the lead frame 8, the corner parts C1 and C2 are preferably coated with the stress mitigation resin 13.

The stress generated at the corner part C2 of Comparative Example is dispersed to the corner parts C3 and C4 in the present embodiment. For this reason, the present embodiment produces a higher effect of stress mitigation than that of Comparative Example. Further, the stress mitigation resin 13 is applied to the step 14 when applied to the end of the lead frame 8. This can suppress wet spreading.

When after adhesion of the case 11 and the base plate 1, the stress mitigation resin 13 is applied from the device upper surface, in Comparative Example, covering of the corner part C1 is easy, but covering of the corner part C2 is difficult. In contrast, in the present embodiment, the interval between the corner part C3 and the corner part C4 is short. For this reason, both applications can be performed at the same time when the application to the step 14 is performed. Incidentally, the thickness and the length of the step 14, namely, the interval between C3 and C4 and the interval between C3 and C5 are not limited, and may be set at the suitable interval according to the viscosity of the stress mitigation resin 13.

Figure 9:
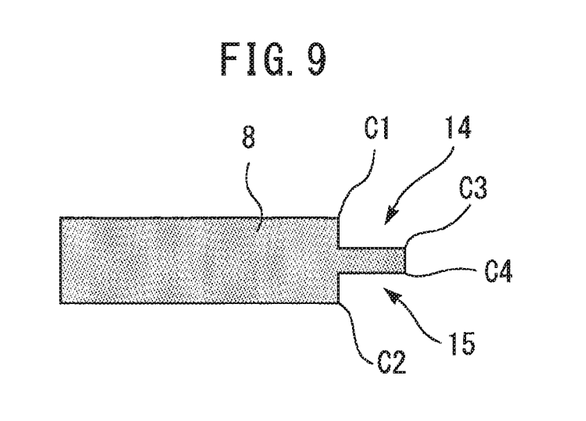
FIG. 9 is a cross sectional view illustrating Modified Example 1 of the end of the lead frame according to Embodiment 2 of the present invention.

FIG. 9 is a cross sectional view illustrating Modified Example 1 of the end of the lead frame according to Embodiment 2 of the present invention. An upper-/lower-surface thin type structure is formed in which steps 14 and 15 resulting in a smaller thickness of the lead frame 8 are disposed on the upper surface and the lower surface of the end of the lead frame 8, respectively. The stress mitigation resin 13 is applied to the upper part of the step 14 and the lower part of the step 15. As a result, the steps 14 and 15 of the end of the lead frame 8 can be covered with the stress mitigation resin 13.

However, it is difficult to apply the stress mitigation resin 13 to the corner part C2 after adhesion of the case 11 and the base plate 1. Thus, when the stress mitigation resin 13 is applied before adhesion of the case 11, the intervals between C1 and C2, and C3 and C4 can be adjusted according to the viscosity of the stress mitigation resin 13, thereby applying the stress mitigation resin 13 to the corner parts. For this reason, it is possible to obtain a semiconductor device with high reliability. Incidentally, it is naturally understood that the effects are not affected even when the stress mitigation resin 13 is applied not only to the steps 14 and 15 but also to other portions.

Figure 10:
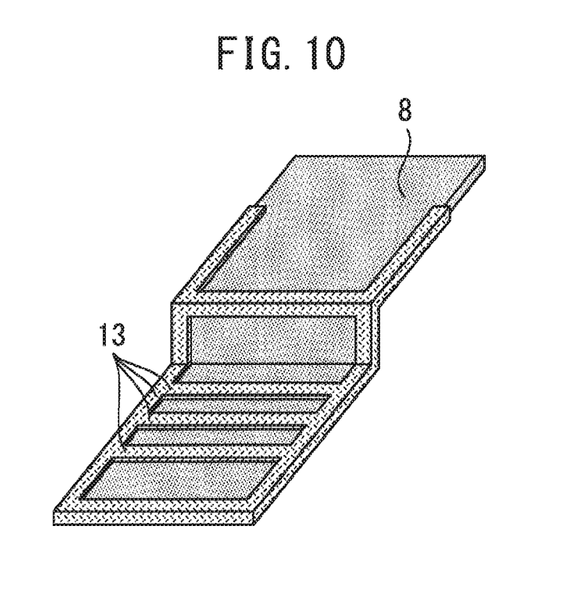
FIG. 10 is a perspective view illustrating Modified Example 2 of the end of the lead frame according to Embodiment 2 of the present invention.

FIG. 10 is a perspective view illustrating Modified Example 2 of the end of the lead frame according to Embodiment 2 of the present invention. It is difficult to ensure the film thickness of the stress mitigation resin 13 to be applied to the upper part of the step 14 according to the kind of the stress mitigation resin 13. Thus, the stress mitigation resin 13 is applied in a plurality of lines in parallel with one another on the upper surface of the lead frame 8. This results in a longer travel path of the sealing resin 12 flowed to the upper surface of the lead frame 8 from a direction at right angles thereto. For this reason, running around of the sealing resin 12 can be suppressed, thereby preventing generation of void traps in the sealing resin 12.

In the drawing, the number of the linear stress mitigation resins 13 is 4. However, it is naturally understood that the number may be increased or decreased according to the viscosity of the sealing resin 12 and the thickness of the stress mitigation resin 13. The shape of the stress mitigation resin 13 is not limited to a linear shape, and may be a curved shape. Incidentally, the configuration in which the stress mitigation resin 13 is applied in a plurality of lines is not limited to Embodiment 2, and is also applicable to other embodiments.

Embodiment 3

Figure 11:
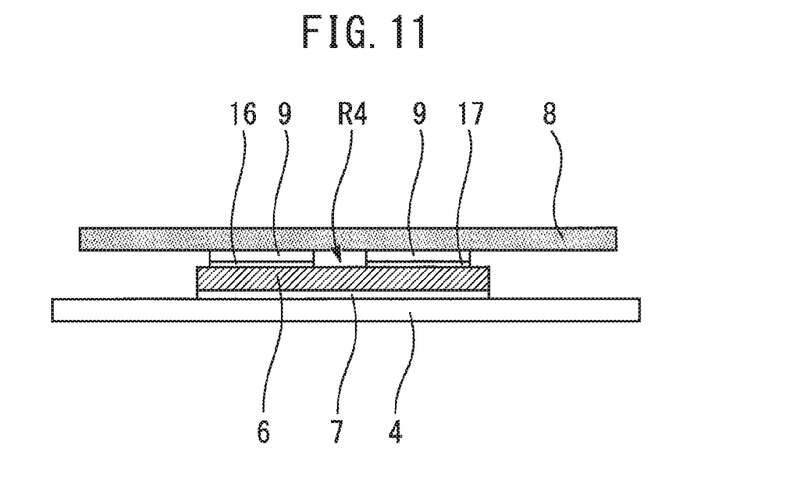
FIG. 11 is a cross sectional view showing a semiconductor device according to Embodiment 3.

FIG. 11 is a cross sectional view showing a semiconductor device according to Embodiment 3. On the upper surface of the semiconductor chip 6, a temperature sensor or a wire such as a gate is disposed. For this reason, an emitter electrode is divided into top electrodes 16 and 17 spaced apart from each other. Using joint materials 9 such as solder, a lead frame 8 is bonded to the top electrodes 16 and 17. A tunnel R4 not bonded with the lead frame 8 is present between the joint materials 9 of the top electrodes 16 and 17.

Figure 12:
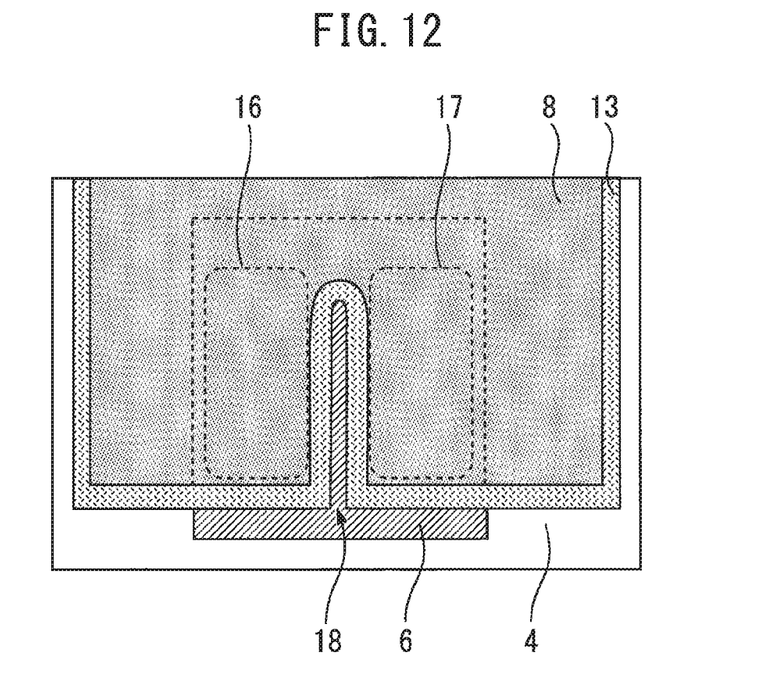
FIG. 12 is a plan view showing the semiconductor device according to Embodiment 3 of the present invention.

FIG. 12 is a plan view showing the semiconductor device according to Embodiment 3 of the present invention. The sealing resin 12 is less likely to flow into the tunnel R4. For this reason, voids tend to be accumulated in the sealing resin 12. Thus, the lead frame 8 has a notch 18 between the top electrode 16 and the top electrode 17 in a plan view perpendicular to the upper surface of the semiconductor chip 6. The stress mitigation resin 13 is also disposed around the notch 18.

The notch 18 eliminates a part of the lead frame 8 serving as a cover on the tunnel R4. For this reason, the sealing resin 12 becomes more likely to flow into the tunnel R4, so that voids can be suppressed. As a result, by combining the control of the flowability of the sealing resin 12 by each stress mitigation resin 13 of Embodiments 1 and 2, it is possible to further suppress the voids.

Incidentally, the semiconductor chip 6 is not limited to the one formed of silicon, and may be the one formed of a wide bandgap semiconductor having a larger bandgap than that of silicon. The wide bandgap semiconductor is, for example, silicon carbide, gallium nitride type material, or diamond. The present embodiment suppresses resin cracking caused by the difference in linear expansion coefficient between members when the semiconductor device is used in a temperature region as high as 150° C. or more, and hence, is particularly effective for the case using the semiconductor chip 6 formed of the wide bandgap semiconductor.

A semiconductor chip 6 formed of such a wide-bandgap semiconductor has a high voltage resistance and a high allowable current density, and thus can be miniaturized. The use of such a miniaturized semiconductor chip 6 enables the miniaturization and high integration of the semiconductor device in which the semiconductor chip 6 is incorporated. Further, since the semiconductor chip 6 has a high heat resistance, a radiation fin of a heatsink can be miniaturized and a water-cooled part can be air-cooled, which leads to further miniaturization of the semiconductor device. Further, since the semiconductor chip 6 has a low power loss and a high efficiency, a highly efficient semiconductor device can be achieved.

Fourth Embodiment

In this embodiment, the semiconductor devices according to the first to third embodiments described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 13:
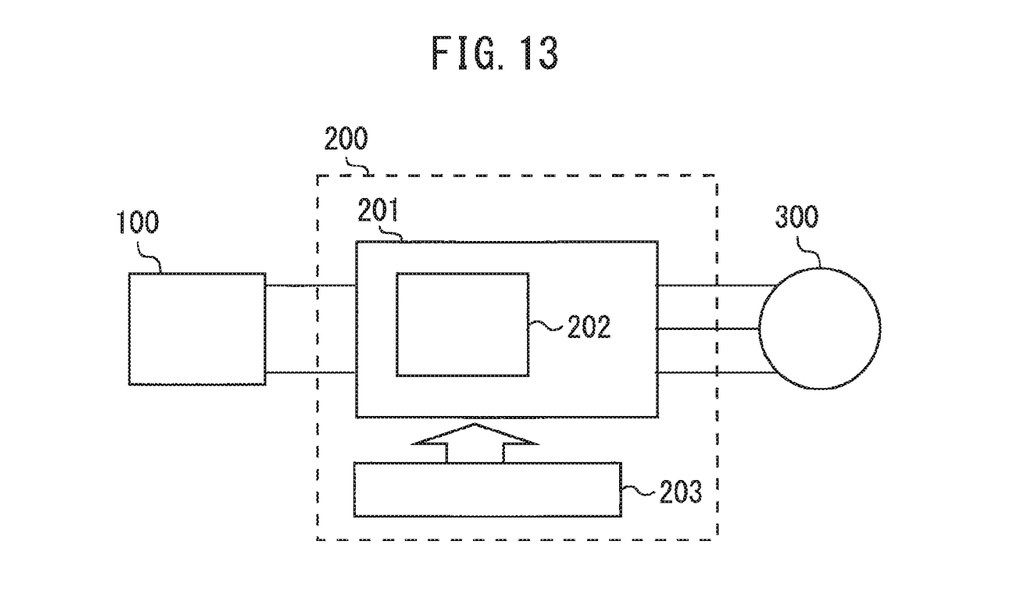
FIG. 13 is a block diagram illustrating a configuration of an electric power conversion system to which the electric power conversion device according to the fourth embodiment is applied.

FIG. 13 is a block diagram illustrating a configuration of an electric power conversion system to which the electric power conversion device according to the fourth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to third embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In this embodiment, the semiconductor devices according to the first to third embodiments are applied as the semiconductor device 202. Accordingly, a semiconductor device and a power conversion device with high insulation reliability can be obtained by suppressing peeling and cracking of the sealing resin, and reducing voids left in the sealing resin.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

REFERENCE SIGNS LIST 2 insulation substrate; 6 semiconductor chip; 8 lead frame; 11 case; 12 sealing resin; 13 stress mitigation resin; 14,15 step; 16,17 top electrode; 18 notch; 200 electric power conversion device; 201 main conversion circuit; 202 semiconductor device; 203 control circuit

The invention claimed is:

1. A semiconductor device comprising:
an insulation substrate;
a semiconductor chip disposed on the insulation substrate;
a lead frame bonded to an upper surface of the semiconductor chip;
a sealing resin covering the semiconductor chip, the insulation substrate, and the lead frame; and
a stress mitigation resin partially applied to an upper surface of an end edge of the lead frame without contacting the semiconductor chip or insulation substrate, and having a lower elastic modulus than that of the sealing resin, wherein
a lower surface of the end edge of the lead frame is covered by the sealing resin and is not covered by the stress mitigation resin, and the stress mitigation resin is not on a bottom surface of the lead frame.

2. The semiconductor device according to claim 1, wherein
an upper surface of the lead frame has an exposed part not covered with the stress mitigation resin, and
the exposed part is surrounded by the stress mitigation resin to form a dam structure.

3. The semiconductor device according to claim 2, further comprising
a case surrounding the semiconductor chip, the insulation substrate, and the lead frame,
in the dam structure, the exposed part is surrounded by only the stress mitigation resin, is surrounded by the stress mitigation resin and a bending part of the lead frame, or is surrounded by the stress mitigation resin and an inner wall of the case.

4. The semiconductor device according to claim 1, wherein
a step resulting in a smaller thickness of the lead frame is provided on an upper surface of the end of the lead frame, and the stress mitigation resin is applied to an upper part of the step.

5. The semiconductor device according to claim 1, wherein
steps resulting in a smaller thickness of the lead frame are disposed on an upper surface and a lower surface of the end of the lead frame, and the stress mitigation resin is applied to an upper part and a lower part of the steps.

6. The semiconductor device according to claim 1, wherein
the stress mitigation resin is applied in a plurality of lines in parallel with one another on the upper surface of the lead frame.

7. The semiconductor device according to claim 1, wherein
the semiconductor chip includes first and second top electrodes provided on the upper surface of the semiconductor chip, spaced apart from each other, and bonded to the lead frame, and
the lead frame has a notch between the first top electrode and the second top electrode in a plan view perpendicular to the upper surface of the semiconductor chip.

8. The semiconductor device according to claim 1, wherein
the stress mitigation resin covers not only an upper surface but also a side surface of the end of the lead frame.

9. The semiconductor device according to claim 1, wherein
an upper surface of the stress mitigation resin is higher than an upper surface of the lead frame by 5 μm to 5 mm.

10. The semiconductor device according to claim 1, wherein
the elastic modulus of the stress mitigation resin is 2 GPa to 8 GPa.

11. The semiconductor device according to claim 1, wherein
the semiconductor chip is made of a wide-band-gap semiconductor.

12. An electric power conversion device comprising:
a main conversion circuit including the semiconductor device according to claim 1, converting input power and outputting converted power; and
a control circuit outputting a control signal for controlling the main conversion circuit to the main conversion circuit.

13. A semiconductor device comprising:
an insulation substrate;
a semiconductor chip disposed on the insulation substrate;
a lead frame bonded to an upper surface of the semiconductor chip;
a sealing resin covering the semiconductor chip, the insulation substrate, and the lead frame; and
a stress mitigation resin applied to an end edge of the lead frame without contacting the semiconductor chip or insulation substrate, and having a lower elastic modulus than that of the sealing resin, wherein
the stress mitigation resin is applied only to upper surfaces and/or side surfaces of the lead frame, so that the stress mitigation resin is not on a bottom surface of the lead frame.

14. The semiconductor device according to claim 1, wherein
the lead frame includes the bottom surface that is bonded to the upper surface of the semiconductor chip, a top that is opposite the bottom surface, side surfaces connecting the top surface of the lead frame and the bottom surface of the lead frame, and at least one end surface defining an end of the lead frame,
the stress mitigation resin is applied to the side surfaces, the end of the lead frame, and the top surface of the lead frame, and
along the top surface of the lead frame in a portion other than the end of the lead frame, the stress mitigation resin is applied along a first direction to extend from the stress mitigation resin applied on one side surface to the stress mitigation resin applied on the other side surface.

15. The semiconductor device according to claim 1, wherein
the stress mitigation resin is applied to side edges of the lead frame extending from the end edge of the lead frame such that exterior surfaces of the stress mitigation resin applied to the side edges face each other across an upper surface of the lead frame.

* * * * *